United States Patent
Lisart et al.

(10) Patent No.: US 9,224,701 B2
(45) Date of Patent: Dec. 29, 2015

(54) PROTECTION OF AN INTEGRATED CIRCUIT AGAINST ATTACKS

(71) Applicant: STMicroelectronics (Rousset) SAS, Rousset (FR)

(72) Inventors: Mathieu Lisart, Aix en Provence (FR); Sylvie Wuidart, Pourrieres (FR); Alexandre Sarafianos, Marseilles (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/667,232

(22) Filed: Mar. 24, 2015

(65) Prior Publication Data

US 2015/0194393 A1 Jul. 9, 2015

Related U.S. Application Data

(63) Continuation of application No. 14/085,565, filed on Nov. 20, 2013, now Pat. No. 9,012,911.

(30) Foreign Application Priority Data

Nov. 21, 2012 (FR) ...................................... 12 61066

(51) Int. Cl.
  *H01L 23/58* (2006.01)
  *H01L 23/00* (2006.01)
  *H01L 21/66* (2006.01)
  *G06F 21/75* (2013.01)

(52) U.S. Cl.
  CPC .............. *H01L 23/576* (2013.01); *G06F 21/75* (2013.01); *H01L 22/14* (2013.01); *H01L 22/30* (2013.01); *H01L 22/34* (2013.01); *H01L 2924/0002* (2013.01); *Y10T 307/76* (2015.04)

(58) Field of Classification Search
  CPC ....... H01L 23/576; H01L 22/14; H01L 22/34; H01L 22/30; H01L 2924/0002; G06F 21/75; Y10T 307/76
  See application file for complete search history.

(56) References Cited

U.S. PATENT DOCUMENTS

| 6,049,117 | A | 4/2000 | Fukunaga et al. |
| 6,342,401 | B1 | 1/2002 | Tom |
| 8,809,858 | B2 * | 8/2014 | Lisart ...................... H01L 23/57 257/47 |
| 8,946,859 | B2 * | 2/2015 | Lisart .................... H01L 21/763 257/48 |
| 2005/0029653 | A1 | 2/2005 | Aumuller et al. |
| 2007/0121575 | A1 | 5/2007 | Savry et al. |
| 2009/0251168 | A1 | 10/2009 | Lisart et al. |
| 2010/0187527 | A1 | 7/2010 | Van Geloven et al. |
| 2010/0315108 | A1 | 12/2010 | Fornara et al. |
| 2011/0234307 | A1 * | 9/2011 | Marinet .................. G06F 21/72 327/538 |
| 2012/0223309 | A1 | 9/2012 | Mowry et al. |
| 2013/0193437 | A1 | 8/2013 | Lisart et al. |

FOREIGN PATENT DOCUMENTS

DE  10204875 C1  2/2003

* cited by examiner

*Primary Examiner* — Victor A Mandala
(74) *Attorney, Agent, or Firm* — Seed IP Law Group PLLC

(57) ABSTRACT

An integrated circuit, including: a semiconductor substrate of a first conductivity type; a plurality of regions of the first conductivity type vertically extending from the surface of the substrate, each of the regions being laterally delimited all along its periphery by a region of the second conductivity type; and a device for detecting a variation of the substrate resistance between each region of the first conductivity type and an area for biasing the substrate to a reference voltage.

18 Claims, 3 Drawing Sheets

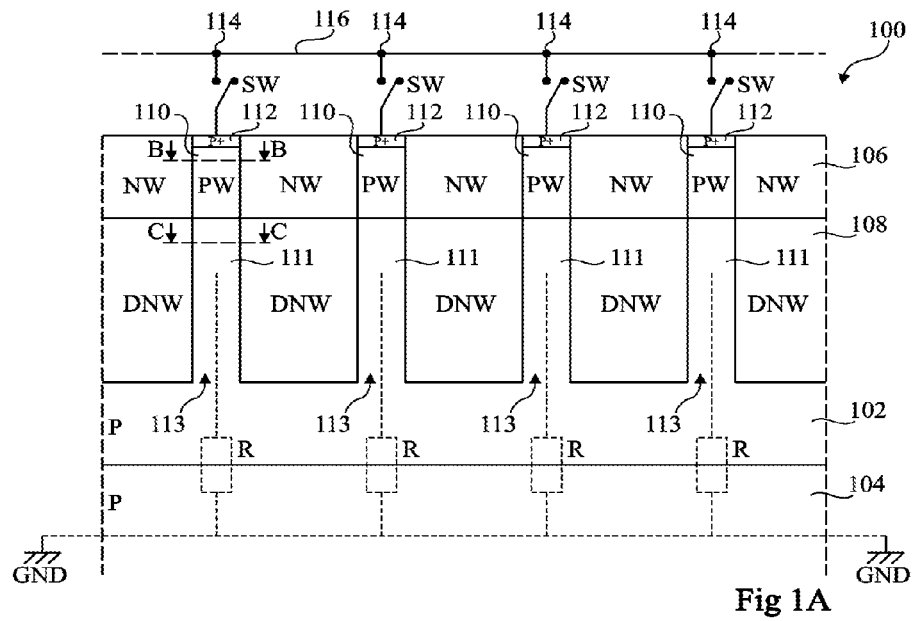
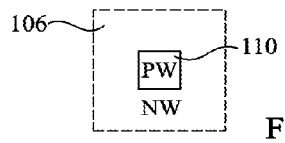 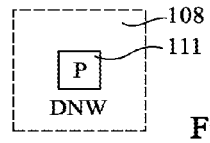
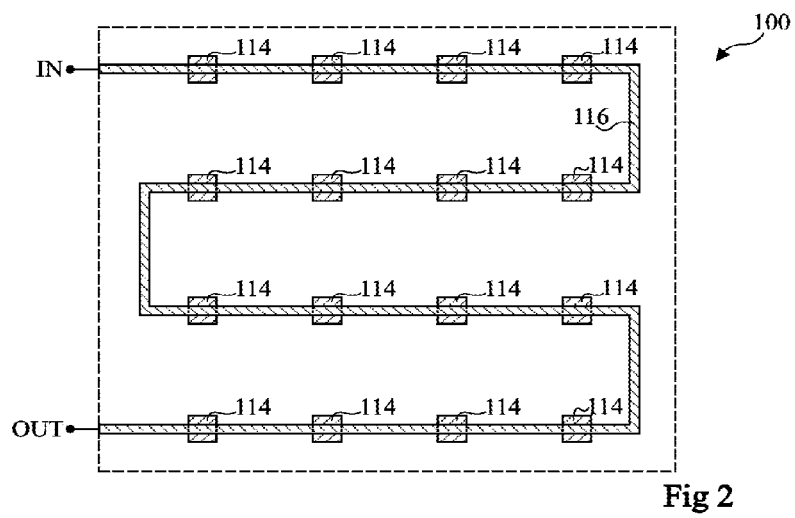

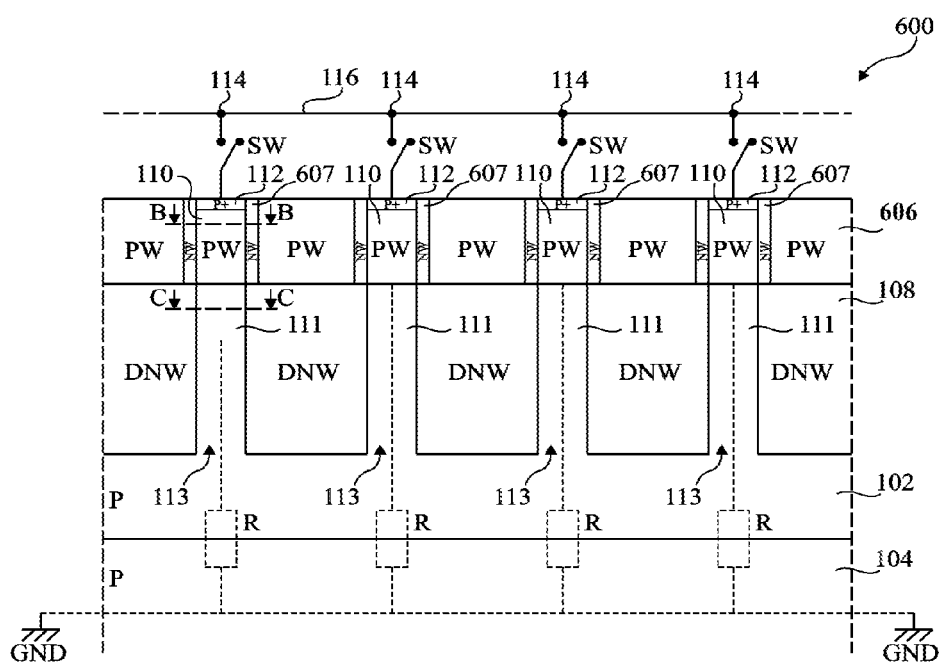
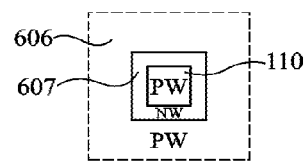
Fig 6B
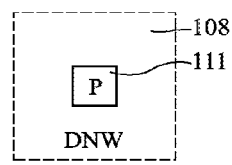
Fig 6C

PROTECTION OF AN INTEGRATED CIRCUIT AGAINST ATTACKS

BACKGROUND

1. Technical Field

The present disclosure relates to the protection of an integrated circuit against external attacks and, in particular, against attacks carried out from the back side of the integrated circuit. The present disclosure also relates to the protection against attacks carried out from the front side of the integrated circuit.

2. Description of the Related Art

It may be desirable to protect an integrated circuit against external attacks aiming, for example, at determining the circuit structure and operation, at accessing confidential data stored in the circuit, or at disturbing the circuit operation. An example of such attacks comprises partially etching insulating layers from the front surface of the integrated circuit to access metal tracks, and creating metal pads connected to these tracks to measure the signals which transit therethrough. Another example of such attacks comprises locally etching the substrate from the back side of the integrated circuit to access active regions of the integrated circuit, and creating metal pads connected to these regions to measure the signals which transit therethrough. Devices for protecting an integrated circuit against attacks from the front side or from the back side have been provided. Such devices however pose various problems.

BRIEF SUMMARY

Thus, an embodiment provides an integrated circuit comprising: a semiconductor substrate of a first conductivity type; a plurality of regions of the first conductivity type vertically extending from the surface of the substrate, each of the regions being laterally delimited all along its periphery by a region of the second conductivity type; and a device for detecting a variation of the substrate resistance between each region of the first conductivity type and an area for biasing the substrate to a reference voltage.

According to an embodiment, the substrate contains at least one well defining an active area of the integrated circuit, the regions of the first conductivity type extending down to a depth at least equal to that of the well.

According to an embodiment, the regions of the first conductivity type extend down to a depth greater than that of the well.

According to an embodiment, the integrated circuit further comprises a region of the second conductivity type extending under at least a portion of the well, the regions of the first conductivity type extending down to a depth at least equal to that of the region of the second conductivity type.

According to an embodiment, each of the regions of the first conductivity type is connected to a node of application of a voltage via a switch.

According to an embodiment, the nodes are interconnected by a conductive path formed on the front side of the integrated circuit.

According to an embodiment, the device is capable of detecting a breakage of the conductive path.

According to an embodiment, the device is further capable of implementing measures for protecting the integrated circuit.

According to an embodiment, the semiconductor substrate is formed of a layer of semiconductor material grown by epitaxy on a semiconductor support.

BRIEF DESCRIPTION OF THE SEVERAL VIEWS OF THE DRAWINGS

The foregoing and other features and advantages will be discussed in detail in the following non-limiting description of specific embodiments in connection with the accompanying drawings.

FIGS. 1A to 1C and FIG. 2 illustrate an example of an integrated circuit provided with an embodiment of a device of protection against attacks;

FIGS. 6A to 6C illustrate another example of an integrated circuit provided with an embodiment of a device of protection against attacks.

For clarity, the same elements have been designated with the same reference numerals in the different drawings and, further, as usual in the representation of integrated circuits, the various drawings are not to scale.

DETAILED DESCRIPTION

Figure 3:
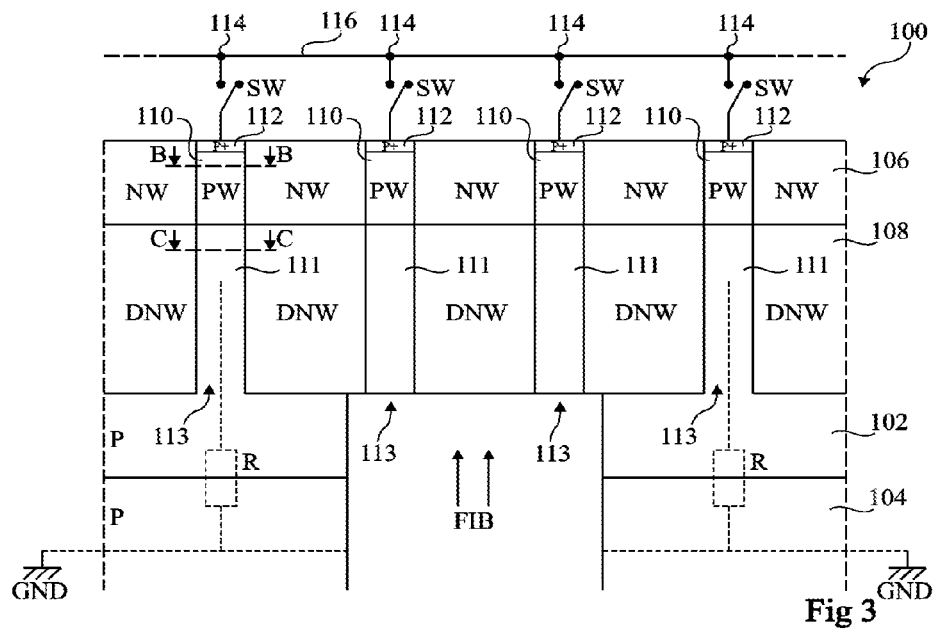
FIG. 3 is a cross-section view showing the integrated circuit of FIG. 1A when a back-side attack is being implemented.

As an example, a device of protection against attacks from the front side of an integrated circuit may comprise metal tracks formed in the last metallization level(s) of the integrated circuit (that is, the level(s) most remote from the substrate), which cover the metal tracks transmitting useful signals of the circuit. The protection device may further comprise a circuit capable of detecting a breakage of the metal tracks of the protection device and, when a breakage is detected, of implementing measures for protecting the integrated circuit, such as stopping the circuit or deleting confidential data stored in the circuit. A problem is that such a protection device is less effective against attacks from the back side of the integrated circuit.

As an example, a device of protection against attacks from the back side of an integrated circuit may comprise a protection package encapsulating the integrated circuit, as well as a circuit capable of detecting an unauthorized opening of the package and, in case of a fraudulent opening, of implementing measures for protecting the integrated circuit such as stopping the circuit or deleting confidential data stored in the circuit. A problem is that such a protection device is bulky and relatively expensive to form.

Embodiments described hereinafter overcome all or part of these problems.

According to a first aspect of an embodiment, to detect back-side attacks on an integrated circuit, it is provided to define, under active areas of the circuit, a path having its resistance measured, an increase in the resistance of this path meaning an etching of the substrate under at least a portion of the active areas, and thus a back-side attack on the integrated circuit.

FIGS. 1A to 1C and 2 illustrate an example of an integrated circuit 100 provided with an embodiment of a device that protects against attacks. FIGS. 1A and 2 are partial respective cross-section and top views of integrated circuit 100. FIGS.

1B and 1C are partial cross-section views of FIG. 1A along planes B-B and C-C of FIG. 1A.

Integrated circuit 100 comprises a semiconductor substrate 102, for example, made of silicon, having active portions of the integrated circuit formed in an upper portion thereof. In the shown example, substrate 102 is a layer grown by epitaxy on a semiconductor support 104. As a variation, substrate 102 may be a low-resistivity solid substrate, with no upper epitaxial layer. In the shown example, substrate 102 and support 104 are P-type doped (P). As an example, substrate 102 and support 104 may be doped with a dopant concentration such that their resistivity is on the order of 10 Ω·cm, for example, ranging between 8 and 12 Ω·cm.

In an upper portion of substrate 102 is formed at least one semiconductor well 106 which defines an active area of circuit 100, wherein electronic components may be formed. In this example, a single N-type doped well 106 (NW) has been shown. Under active area 106 is formed an N-type doped 108 region (DNW) having a lower doping level than area 106.

Active area 106 and underlying region 108 are vertically crossed by P-type doped regions 113 emerging into substrate 102 which, as will be seen hereafter, take part in the detection of back-side attacks. In this example, each region 113 comprises an upper portion 110 having a higher doping level (PW) than substrate 102, extending from the front side of the substrate down to a depth similar or equal to that of active area 106. In this example, each region 113 further comprises a lower portion 111 of same doping level as substrate 102, extending from the lower surface of region 110 down to a depth similar or equal to that of region 108. Each region 113 is thus laterally surrounded, along its entire periphery, with an N-type doped region, that is, well 106 and region 108 that it crosses in this example. In the shown example, regions 113 have, in top view (FIGS. 1B and 1C), the shape of squares having a side length ranging from a few hundreds of nanometers to a few micrometers, for example, a side length shorter than 5 µm. Other shapes and/or dimensions may however be provided. In top view, the surface area occupied by regions 113 is preferably much smaller than the surface area occupied by the active areas of the integrated circuit. In a preferred embodiment, regions 113 are distributed inside of or close to the critical active areas of the integrated circuit, so that, in top view, regions 113 take up less than 1% of the active area of the integrated circuit. As an example, the depth of active areas 106 and of regions 110 may range between 0.8 and 1.2 µm, for example, being on the order of 1 µm, and the depth of regions 108 and 111 may range between 1.6 and 2.4 µm, for example, being on the order of 2 µm. Regions 110 may be doped with a dopant concentration such that their resistivity is on the order of 0.1 Ω·cm, for example, between 0.08 and 0.12 Ω·cm. The dopant concentrations of regions 106 and 108 may be close to each other. As an example, the resistivity of region 108 may be approximately twice that of regions 110. The described embodiments are however not limited to the above-mentioned numerical examples. At the surface of regions 110, regions 112 of low thickness and heavily P-type doped (P+) may be provided. Regions 112 provide an improved electric contact on regions 110. Contact pads (not shown) made of a conductive material may be formed on regions 112 to apply a voltage on underlying regions 110. In the shown example, each region 110 is connected to a node or to a terminal 114 of application of a voltage, via a switch SW, for example, a MOS transistor formed in active area 106 of the integrated circuit. In the shown example, nodes 114 are connected to one another by conductive metal tracks 116. In operation, substrate 102 is biased to a reference voltage, for example, the ground (GND), via one or several bias contacting areas, not shown. As an example, P-type doped contacting regions may extend at the periphery of the integrated circuit, to enable, in operation, to bias the substrate to a reference voltage.

According to the first aspect, to detect a back-side attack on integrated circuit 100, it is provided to monitor, for each of regions 113, the value of resistance R of the electric path between node 114 coupled to region 113, and substrate 102, or more specifically, between node 114 coupled to region 113 and a node or rail of application of a reference voltage GND to circuit 100. An increase in resistance R of one of the electric paths thus defined may mean that an etching of the back side of circuit 100 has been performed under region 113.

FIG. 3 is a cross-section view illustrating the implementation of an attack by focused ion beam (FIB) on circuit 100. Such an attack is performed on a local surface of the back side of the integrated circuit, and the thickness decrease from the back side is generally performed on widths on the order of some hundred micrometers. In this type of attack, support 104 and at least a portion of substrate 102 are removed from the attacked area. If the attack is performed under a region 113 of the protection device (as shown in FIG. 3), the removal of support 104 and of a portion of substrate 102 under this region causes an increase in the resistance of the electric path between node 114 connected to this region and substrate 102. It should further be noted that the steps of etching by heavy ion bombarding are generally provided to stop on an interface between two doped regions of opposite conductivity types, or on an insulating region. This strategy is generally adopted by attackers since it enables to remove matter from the back side all the way to doped regions close to the surface of the semiconductor layer having the electronic components formed therein, which limits the depth of the last wells of access to signals of the integrated circuit. In the case of the structure provided herein, the FIB-type attack will probably stop at the interface between substrate 102 (P) and well 108 (DNW). The electric path between node 114 and substrate 102 may thus even be totally interrupted (infinite resistance). Regions 113 are preferably by a sufficient number and sufficiently close to one another for the substrate to be etched under at least one region 113 in case of an attack by FIB etching on the back side. As an example, neighboring regions 113 are separated two-by-two by a distance approximately ranging from 50 to 100 µm. Regions 113 are for example arranged in an array (in top view).

According to a second aspect, the device for protecting integrated circuit 100 may be provided to enable detection of front-side attacks.

For this purpose, conductive tracks 116 connecting nodes 114 to one another may be formed in the last metallization level(s) of the integrated circuit, and define a conductive path between an input terminal or node IN of the protection device, and an output terminal or node OUT of the protection device (FIG. 2). In a preferred embodiment, the metal tracks of conductive path 116 are arranged so that it is difficult or even impossible for an attacker to access critical regions of circuit 100 from the front side without breaking conductive path 116. As an example, the metal tracks of path 116 at least partly cover metal tracks intended to transmit useful signals of circuit 100. To detect a front-side attack on integrated circuit 100, it may be provided to monitor the entire conductive path 116 between node IN and node OUT of the protection device.

Figure 4:
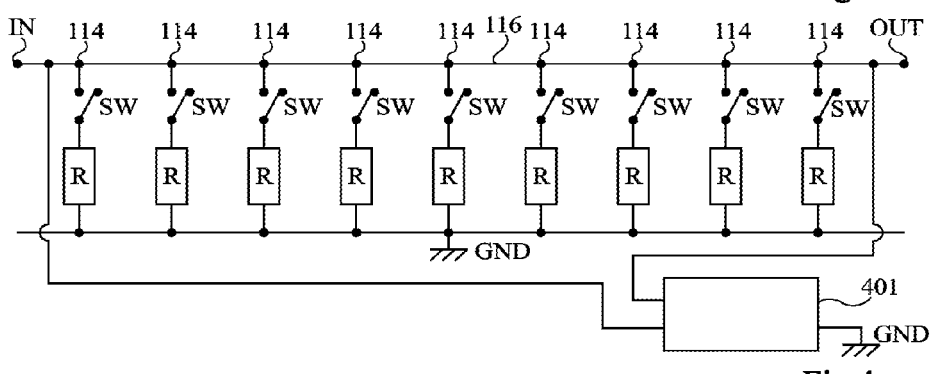
FIG. 4 is a simplified electric diagram of the device for protecting the integrated circuit of FIGS. 1A to 1C and 2.

FIG. 4 is a simplified electric diagram of the protection device described in relation with FIGS. 1A to 1C, 2, and 3. The protection device comprises conductive path 116, connected by a first end to input node IN and by a second end to output node OUT, and running through the plurality of nodes 114. Each node 114 is connected to a terminal or rail of application of a reference voltage GND by a branch comprising a switch SW in series with a resistor R, which corresponds to the resistance of the electric path between the front surface of region 113 coupled to node 114, and the ground. The protection device thus comprises, in parallel between conductive path 116 and the ground (or substrate 102), a plurality of branches, each comprising a switch SW in series with an electric path of resistance R, running through substrate 102 under active regions of the integrated circuit. In the shown example, the protection device of FIG. 4 further comprises a circuit 401 capable of individually controlling switches SW, of applying a potential difference between conductive path 116 and the ground, and of detecting a possible variation of resistance R of the electric path of one of the above-mentioned parallel branches. Circuit 401 may further be capable of detecting a breakage of conductive path 116 between node IN and node OUT.

Figure 5A:
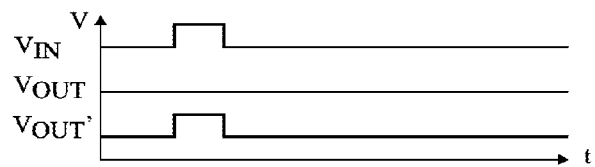
FIGS. 5A and 5B are timing diagrams illustrating the operation of the device for protecting the integrated circuit of FIGS. 1A to 1C and 2.

FIG. 5A very schematically illustrates an example of operation of the protection device of FIG. 4 according to the first aspect, that is, when it is used to detect a back-side attack on integrated circuit 100. FIG. 5A is a timing diagram illustrating the variation along time, in a back-side attack detection phase, of a voltage $V_{IN}$ applied by circuit 401 between node $V_{IN}$ and the ground, of a voltage $V_{OUT}$ read from node OUT in the absence of any back-side attack, and of a voltage $V_{OUT}'$ read from node OUT in case of a back-side attack.

In a back-side attack detection phase, resistances R of the electric paths defined by regions 113 are successively tested one after the others. To test resistance R of one of the branches of the protection device, switch SW of this branch is turned on, and all other switches SW are turned off. A non-zero voltage $V_{IN}$, for example, positive, is applied between node IN and the ground. In this example, voltage $V_{IN}$ is applied in the form of a relatively short pulse. When no attack is implemented, resistance R of the electric path of the tested branch is at a relatively low value and the pulse applied on node IN is at least partly drained off towards ground via this resistance. The pulse applied to node IN then is not transmitted to node OUT, or, if it is, is transmitted with a relatively significant attenuation (signal $V_{OUT}$). In case of a local back-side attack under region 113 of the tested branch, resistance R has a value greater than its normal value, or even an infinite value. The pulse applied to node IN is thus transmitted to node OUT with no attenuation, or with a relatively low attenuation (signal $V_{OUT'}$). Thus, for a given pulse level applied to node IN, the pulse level read from node OUT is different according to whether an etching of the substrate has or not been performed in front of region 113 of the tested branch. Circuit 401 is capable of detecting an abnormal pulse level on node OUT, and of deducing therefrom that a back-side attack is going on. The detection phase of FIG. 5A may be repeated as many times as the protection device comprises parallel branches, by each time selecting a new branch to be tested by means of switches SW. For the proper operation of the device, in back-side attack detection phases, it is preferably provided to apply a pulse level $V_{IN}$ such that the voltage applied between the front surface of region 113 of the selected branch and the ground is smaller than the threshold voltage of the PN junction between region 110 and active area 106, and than the threshold voltage of the PN junction between region 111 and region 108 (typically, 0.6 V).

Figure 5B:
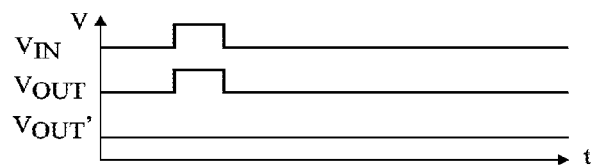

FIG. 5B schematically illustrates an example of operation of the protection device of FIG. 4 according to the second aspect, that is, when it is used to detect a front-side attack on integrated circuit 100. FIG. 5B is a timing diagram illustrating the variation along time, in a front-side attack detection phase, of a voltage $V_{IN}$ applied by circuit 401 between node $V_{IN}$ and the ground, of a voltage $V_{OUT}$ read from node OUT in the absence of any front-side attack, and of a voltage $V_{OUT}'$ read from node OUT in case of a front-side attack.

In a front-side attack detection phase, the continuity of conductive path 116 between nodes IN and OUT is tested. To achieve this, in this example, all switches SW of the protection device are turned off, and a non-zero voltage $V_{IN}$, for example, positive, is applied between node IN and the ground. In this example, voltage $V_{IN}$ is applied in the form of a relatively short pulse. When no attack is being implemented, the pulse applied to node IN is transmitted to node OUT by conductive line 116. In case of a front-side attack, conductive path 116 is interrupted, and the pulse applied to node IN is thus not transmitted to node OUT. Circuit 401 is capable of detecting a lack of pulse on node OUT, and of deducing therefrom that a front-side attack is going on.

As an example, front side and/or back-side attack detection phases may be provided, each time integrated circuit 100 is powered on, and/or, periodically and continuously, during the operation of integrated circuit 100.

Circuit 401 may further be capable of implementing, when a front-side and/or back-side attack is detected, measures for protecting integrated circuit 100 such as stopping circuit 100 or deleting confidential data stored in circuit 100.

The attack detection principle described in relation with FIGS. 1A to 1C, FIGS. 2 to 4, and FIGS. 5A and 5B, also applies to integrated circuits comprising active P-type doped regions.

FIGS. 6A to 6C illustrate an example of an integrated circuit 600 comprising P-type doped active regions and provided with a device of protection against attacks of the type described in relation with FIGS. 1A to 1C and 2. FIG. 6A is a partial cross-section view of circuit 600. FIGS. 6B and 6C are partial cross-section views along planes B-B and C-C of FIG. 6A. Circuit 600 has many elements in common with circuit 100 of FIGS. 1A to 1C and 2. Only the differences between these two circuits will be underlined hereafter.

Integrated circuit 600 differs from circuit 100 in that it comprises, in an upper portion of substrate 102, instead of N-type doped well 106 of circuit 100, a P-type doped semiconductor well 606 (PW) which defines an active area of circuit 600 where electronic components may be formed. Like circuit 100, circuit 600 comprises an N-type doped region 108 (DNW) extending under active region 606. Active region 606 and underlying region 108 are, as in circuit 100 vertically crossed by P-type doped regions 113, emerging into substrate 102. In circuit 600, upper portion 110 of each vertical region 113 is laterally delimited by a thin N-type doped region 607 (NW), having a depth similar or equal to that of active area 606, forming a sheath or ring laterally insulating region 110 from active area 606 that it crosses. Each region 113 is thus laterally surrounded, along its entire periphery, with an N-type doped region, that is, region 607 and region 108 that it crosses in this example.

The back-side and/or front-side attack detection principle described in relation with FIGS. 1A to 1C, FIGS. 2 to 4, and FIGS. 5A and 5B applies to integrated circuit 600.

The provided attack detection principle also applies when the integrated circuit to be protected comprises both N-type active regions and P-type active regions.

An advantage of the described integrated circuit protection mode is that it can to protect an integrated circuit not only against back-side attacks, but also against front-side attacks.

Further, this device has the advantage of providing a back-side attack detection as soon as it begins, since resistance R varies as soon as the back-side structure of the device is altered. It also enables detecting an attack at any location of the back side of the integrated circuit if the provided structure is deployed all over the active areas. It further enables locating a back-side attack.

Another advantage is that the semiconductor surface area necessary to form the described protection device is relatively small.

Further, the forming of the provided protection device requires no additional manufacturing step with respect to the forming of an integrated circuit comprising N-type active regions (NW), P-type active regions (PW), and a deep N-type region (DNW) located under the N- and/or P-type active regions.

Specific embodiments have been described. Various alterations, modifications, and improvements will readily occur to those skilled in the art.

In particular, all the conductivity types of the different regions of the devices described in relation with FIGS. 1A to 1C, and 6A to 6C, may be inverted with respect to what has been described.

Further, the described embodiments are not limited to the protection of integrated circuits comprising a buried region 108 extending under all the active areas of the circuit. More generally, it will be within the abilities of those skilled in the art to obtain the desired operation by providing a protection device comprising a plurality of vertical regions of the same conductivity type as the substrate, laterally surrounded, along their entire periphery, with regions having a conductivity type opposite to that of the substrate, such vertical regions being at least as deep, or even deeper, than the wells defining the active circuit areas.

Further, the described embodiments are not limited to the examples of operation described in relation with FIGS. 5A and 5B. To detect back-side attacks, any circuit enabling measurement of a variation of resistance R of an electric path of a branch of the protection device may be used to replace circuit 401 described in relation with these drawings. Further, to detect front-side attacks, any circuit enabling detection of the interruption of conductive path 116 may be used to replace circuit 401.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A device, comprising:
a semiconductor substrate having a first surface opposite to a second surface;
a first plurality of regions formed in the first surface of the substrate, the first plurality of regions having a first conductivity type, the first plurality of regions being separated from each other by a plurality of portions of the substrate;
a second plurality of regions formed in the first surface of the substrate and positioned between ones of the first plurality of regions, the second plurality of regions having a second conductivity type, the second plurality of regions being arranged in an array of rows and columns, each of the second plurality of regions being separated from each other by the first plurality of regions and being aligned with the plurality of portions of the substrate;
a plurality of terminals electrically coupled to the second plurality of regions; and
a resistance detector coupled to the plurality of terminals and configured to detect a change in resistance between one of the terminals and a corresponding one of the plurality of portions of the substrate.

2. The device of claim 1 wherein the semiconductor substrate has the second conductivity type.

3. The device of claim 1, further comprising a support on the second surface of the substrate.

4. The device of claim 1 wherein the first plurality of regions include a first doped portion and a second doped portion, the second doped portion having a lower doping level than the first doped portion.

5. The device of claim 4 wherein the first doped portion is separated from the second surface of the substrate by the second doped portion.

6. The device of claim 1, further comprising conductive metal tracks on the first surface of the substrate and coupled to the plurality of terminals.

7. The device of claim 6 wherein the conductive metal tracks couple the plurality of terminals to each other in series.

8. The device of claim 1, further comprising:
a third plurality of regions formed in the first surface of the substrate and positioned between the first plurality of regions and the first surface of the substrate, the third plurality of regions having the second conductivity type; and
a fourth plurality of regions formed in the first surface of the substrate, the fourth plurality of regions having the first conductivity type, the fourth plurality of regions separating the third plurality of regions from the second plurality of regions.

9. The device of claim 8 wherein each of the fourth plurality of regions completely laterally surround one of the second plurality of regions.

10. The device of claim 1, further comprising a plurality of switches coupled between the plurality of terminals and the second plurality of regions.

11. The device of claim 10 wherein the resistance detector is configured to control each of the plurality of switches.

12. The device of claim 11 wherein the resistance detector is configured to control each of the plurality of switches individually and is configured to detect a change in resistance that corresponds to an attack on the second surface of the substrate.

13. The device of claim 11 wherein each of the plurality of switches is coupled in series with a resistance through a respective one of the plurality of portions of the substrate to ground.

14. The device of claim 13, further comprising a conductive track coupled to the plurality of terminals, the conductive track configured to couple in parallel each of the plurality of switches that are in series with the resistance.

15. A method, comprising:
forming a first plurality of regions in a first surface of a substrate, the substrate having a second surface opposite to the first surface, the first plurality of regions having a first conductivity type, the first plurality of regions being separated from each other by a plurality of portions of the substrate;
forming a second plurality of regions in an array of rows and columns in the first surface of the substrate and positioned between ones of the first plurality of regions, the second plurality of regions having a second conductivity type, the second plurality of regions being separated from each other by the first plurality of regions and being aligned with the plurality of portions of the substrate;
coupling a plurality of terminals electrically to the second plurality of regions;

coupling a resistance detector to the plurality of terminals; and detecting a change in resistance between one of the terminals and a corresponding one of the plurality of portions of the substrate.

16. The method of claim 15, further comprising forming the first plurality of regions to include a first doped portion and a second doped portion, the second doped portion having a lower doping level than the first doped portion, the second doped portion separating the second surface of the substrate from the first doped portion.

17. The method of claim 15, further comprising forming a plurality of switches between the plurality of terminals and the second plurality of regions and coupling the resistance detector to the plurality of switches for controlling each of the plurality of switches.

18. The method of claim 17, further comprising forming a conductive track coupled to the plurality of terminals, the conductive track configured to couple in parallel each of the plurality of switches that are in series with a resistance in each of the portions of the substrate.

\* \* \* \* \*